US012604567B2

(12) United States Patent
Pu et al.

(10) Patent No.: US 12,604,567 B2
(45) Date of Patent: Apr. 14, 2026

(54) DRIVING SUBSTRATE, MICRO LED TRANSFER DEVICE AND MICRO LED TRANSFER METHOD

(71) Applicant: HKC CORPORATION LIMITED, Shenzhen (CN)

(72) Inventors: Yang Pu, Shenzhen (CN); Haoxuan Zheng, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 390 days.

(21) Appl. No.: 18/204,965

(22) Filed: Jun. 2, 2023

(65) Prior Publication Data

US 2024/0153908 A1    May 9, 2024

(30) Foreign Application Priority Data

Nov. 9, 2022    (CN) .......................... 202211400586.1

(51) Int. Cl.
*H01L 23/00*    (2006.01)
*H01L 25/16*    (2023.01)
(Continued)

(52) U.S. Cl.
CPC .............. *H01L 24/81* (2013.01); *H01L 24/02* (2013.01); *H01L 24/05* (2013.01); *H01L 24/10* (2013.01);
(Continued)

(58) Field of Classification Search
CPC ......... H01L 24/81; H01L 24/02; H01L 24/05; H01L 24/10; H01L 24/13; H01L 24/16; H01L 25/167; H01L 2224/0217; H01L 2224/0224; H01L 2224/05555; H01L 2224/05573; H01L 2224/05609; H01L 2224/05611; H01L 2224/10135; H01L 2224/1016; H01L 2224/13016; H01L 2224/16145; H01L 2224/81002; H01L 2224/81005; H01L 2224/81139;
(Continued)

(56) References Cited

U.S. PATENT DOCUMENTS

2018/0033853 A1*  2/2018  Bower .................. H10F 39/811
2019/0043843 A1*  2/2019  Liu ..................... H01L 25/0753
(Continued)

FOREIGN PATENT DOCUMENTS

CN      203520373 U    4/2014
CN      110998821 A    4/2020
(Continued)

OTHER PUBLICATIONS

Chinese First Office Action, Chinese Application No. 202211400586. 1, mailed Jan. 12, 2023 (11 pages).
(Continued)

*Primary Examiner* — Norman D Richards
*Assistant Examiner* — Laura M Dykes

(57)    ABSTRACT

A driving substrate, a micro LED transfer device and a micro LED transfer method are provided. A side surface of the driving substrate is arranged with a binding metal layer, a positioning layer is arranged around the binding metal layer, and a width of the positioning layer at a position away from the driving substrate is less than that a width at a position close to the driving substrate.

17 Claims, 4 Drawing Sheets

(51) Int. Cl.
H10H 20/831 (2025.01)
H10H 20/857 (2025.01)

(52) U.S. Cl.
CPC ............. H01L 24/13 (2013.01); H01L 24/16 (2013.01); H01L 25/167 (2013.01); H10H 20/831 (2025.01); H10H 20/857 (2025.01); *H01L 2224/0217* (2013.01); *H01L 2224/0224* (2013.01); *H01L 2224/05555* (2013.01); *H01L 2224/05573* (2013.01); *H01L 2224/05609* (2013.01); *H01L 2224/05611* (2013.01); *H01L 2224/10135* (2013.01); *H01L 2224/10165* (2013.01); *H01L 2224/13016* (2013.01); *H01L 2224/16145* (2013.01); *H01L 2224/81002* (2013.01); *H01L 2224/81005* (2013.01); *H01L 2224/81139* (2013.01); *H01L 2224/8114* (2013.01); *H01L 2224/81141* (2013.01); *H01L 2224/818* (2013.01); *H01L 2924/12041* (2013.01); *H01L 2924/13069* (2013.01); *H01L 2924/13091* (2013.01)

(58) Field of Classification Search
CPC ... H01L 2224/8114; H01L 2224/81141; H01L 2224/818; H01L 2924/12041; H01L 2924/13069; H01L 2924/13091; H01L 2223/54426; H10H 20/831; H10H 20/857
USPC .......................................................... 438/26
See application file for complete search history.

(56) References Cited

U.S. PATENT DOCUMENTS

| | | | | |
|---|---|---|---|---|
| 2021/0057258 | A1* | 2/2021 | Kwag | .................... H10D 86/60 |
| 2022/0216370 | A1* | 7/2022 | Hung-Wen | .......... H10H 20/819 |
| 2025/0022987 | A1* | 1/2025 | Zhang | .................... H10D 86/00 |

FOREIGN PATENT DOCUMENTS

| | | | | |
|---|---|---|---|---|
| CN | 111048502 A | 4/2020 | | |
| CN | 111613632 A | 9/2020 | | |
| CN | 211605118 U | 9/2020 | | |
| CN | 111785708 A | 10/2020 | | |
| CN | 112017550 A | 12/2020 | | |
| CN | 112133795 A * | 12/2020 | .......... H10H 29/142 | |
| CN | 112259671 A | 1/2021 | | |
| CN | 114864622 A | 8/2022 | | |
| CN | 115566037 A | 1/2023 | | |
| WO | WO-2020054538 A1 * | 3/2020 | .......... H10H 20/857 | |

OTHER PUBLICATIONS

Notification to Grant Patent Right for Invention, Chinese Application No. 202211400586.1, mailed Feb. 16, 2023 (4 pages).
International Search Report, International Application No. PCT/CN2023/102161, mailed Jul. 31, 2023 (17 pages).

* cited by examiner

DRIVING SUBSTRATE, MICRO LED TRANSFER DEVICE AND MICRO LED TRANSFER METHOD

CROSS REFERENCE TO RELATED APPLICATIONS

The present disclosure claims priority of Chinese Patent Application No. 202211400586.1, filed on Nov. 9, 2022 in China National Intellectual Property Administration, the entire contents of which are hereby incorporated by reference in their entireties.

TECHNICAL FIELD

The present disclosure relates to the field of display panels, in particular to a driving substrate, a micro LED transfer device and a micro LED transfer method.

BACKGROUND

With the development of optoelectronic display technology and semiconductor manufacturing technology, display technologies of an organic light emitting diode (OLED) and a liquid crystal display (LCD) have been mass-produced, and a micro light emitting diode (LED) display technology is also being developed.

The micro LED display technology is considered the best display technology in the future due to advantages of a high stability, a long lifespan, a better display effect, and a higher resolution.

Millions to tens of millions of micro LED chips are required to transfer from a growth substrate to a driving backplane in a production process of a micro LED panel, namely, a massive transfer. When transferring LEDs to the driving backplane by means of a massive transfer technology, an adhesive layer of the transfer substrate is easy to deformation, and there may be some deviation between a design value and an alignment position between the adhesive layer and the backplane circuit. In this case, when a product resolution is high and an alignment area is small, the electrodes of the LED chip may not be accurately aligned to the alignment position, leading to transfer failure.

SUMMARY OF THE DISCLOSURE

In order to solve a problem of a position deviation in a process of transferring a light emitting diode (LED) to a backplane, a driving substrate, a micro LED transfer device and a micro LED transfer method are provided by the present disclosure.

According to a first aspect of the present disclosure, a driving substrate is provided. A side surface of the driving substrate is arranged with a binding metal layer, a positioning layer is arranged around the binding metal layer, and a width of the positioning layer at a position away from the driving substrate is less than a width of the positioning layer at a position close to the driving substrate.

According to a second aspect of the present disclosure, a micro LED transfer device is provided. The micro LED transfer device includes: a transfer substrate; and a micro LED, arranged on the transfer substrate and configured for transferring the micro LED to the above-mentioned driving substrate. Each micro LED includes two electrodes, and the two electrodes extend to the side away from the transfer substrate; and wherein an end of each of the two electrodes away from the transfer substrate is in a gradually tapered shape.

According to a third aspect of the present disclosure, a micro LED transfer method is provided. The micro LED includes an LED chip, and a first electrode and a second electrode arranged on a surface of the LED chip, the micro LED is disposed on a transfer substrate, and the micro LED transfer method includes: providing a driving substrate; making a binding metal layer on a side surface of the driving substrate; making a positioning layer around the binding metal layer; wherein a width of the positioning layer at a position away from the driving substrate is less than a width of the positioning layer at a position close to the driving substrate; placing a side of the transfer substrate arranged with the first electrode and the second electrode towards the driving substrate, to make the first electrode and the second electrode move in a direction close to the binding metal layer under an assistance of the positioning layer until the first electrode and the second electrode being aligned with the binding metal layer; and removing the transfer substrate to transfer the micro LED from the transfer substrate to the driving substrate.

BRIEF DESCRIPTION OF THE DRAWINGS

In order to illustrate more clearly the technical solutions in the embodiments of the present disclosure, drawings for describing the embodiments will be described briefly in the following. Apparently, the described drawings show only some of the embodiments of the present disclosure, any ordinary skilled person in the art shall obtain other drawings without any creative work.

Figure 1:
FIG. 1 is a structural schematic view of a micro light emitting diode (LED) according to some embodiments of the present disclosure.

REFERENCE NUMERALS IN DRAWINGS 1 transfer substrate; 2 driving substrate; 11 LED chip/micro LED; 111 first electrode; 112 second electrode; 110 epitaxial layer; 12 adhesive layer; 21 binding metal layer; 22 positioning layer; 13 supporting member; 14 positioning member; 15 fracturing member.

DETAILED DESCRIPTION

Technical solutions in the embodiments of the present disclosure will be clearly and completely described below by referring to the accompanying drawings in the embodiments of the present disclosure. Obviously, the described embodiments are only some of but not all of the embodiments of the present disclosure. Based on the embodiments in the present disclosure, all other embodiments obtained by any ordinary skilled person in the art without making creative work shall fall within the scope of the present disclosure.

Terms used in the embodiments of the present disclosure are only for the purpose of describing embodiments, and are not intended to limit the present disclosure. The singular forms of "a", "the" and "said" used in the embodiments of the present disclosure and the attached claims are also intended to include majority forms. Unless other meanings are clearly indicated above, "a plurality of" generally includes at least two forms, but does not exclude a case of including at least one form.

It should be understood that, a term "and/or" used in the present disclosure is only an association relationship describing related objects, and indicates that there may be three relationships, such as A and/or B, which may represent the following situations: including A alone, including A and B simultaneously, and including B alone. In addition, the character "I" in the present disclosure generally indicates that a pre and a post association object are an "or" relationship.

It should be understood that, terms "include", "have", and any variation thereof, are intended to cover non-exclusive inclusion, such that a process, a method, a system, a product, or an apparatus including a series of elements not only includes those listed elements, but also further includes other elements that are not explicitly listed, or may include other may or units that are inherently included in the process, the method, the product or the apparatus. Without further restrictions, the elements defined by the statement "include . . . " do not exclude other same elements that are included in the process, the method, the product or the apparatus.

It should be noted that if the embodiments of the present disclosure involve directional indications (such as up, down, left, right, front, back . . . ), the directional indications are only used to explain the relative position relationship, movement, etc. between members at a specific attitude (as shown in the figures). If the specific attitude changes, the directional indications will also change accordingly.

The "embodiments" of the present disclosure may mean that a particular feature, structure, or property described in an embodiment may be included in at least one embodiment of the present disclosure. Presence of the phrase at various sections in the specification does not necessarily mean a same embodiment, nor is it a separate embodiment or an alternative embodiment that is mutually exclusive with other embodiments. Those skilled person in the art shall explicitly or implicitly understand that the embodiments described herein may be combined with other embodiments.

The design idea of the present disclosure is: in order to reduce a position deviation in a process of transferring a light emitting diode (LED) to a driving substrate, a positioning layer is arranged on the driving substrate to assist a LED electrode to align with a metal layer on the driving substrate.

A micro LED is provided by the present disclosure. As shown in FIG. 1, FIG. 1 is a structural schematic view of a micro LED according to some embodiments of the present disclosure. A micro LED 11 is also known as a LED or a LED chip 11, and includes a LED epitaxial layer 110 and a LED electrode. The LED electrode includes a first electrode 111 and a second electrode 112.

Figure 2:
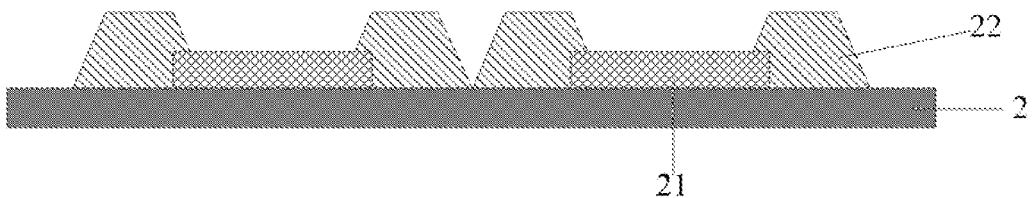
FIG. 2 is a structural schematic view of a driving substrate according to a first embodiment of the present disclosure.

A driving substrate is provided by the present disclosure. As shown in FIG. 2. FIG. 2 is a structural schematic view of a driving substrate according to a first embodiment of the present disclosure. As shown in FIG. 2, a side of a driving substrate 2 close to a transfer substrate 1 is arranged with a binding metal layer 21, and the binding metal layer 21 corresponds to the first electrode 111 and the second electrode 112 respectively. A positioning layer 22 is arranged around the binding metal layer 21, and a width of the positioning layer 22 at a position away from the driving substrate 2 is less than that at a position close to the driving substrate 2.

A sidewall of the positioning layer 22 forms a slope with a certain angle to facilitate the first electrode 111 and the second electrode 112 to slide close to the binding metal layer 21 under the effect of the slope, so as to realize the aligned connection between the first electrode 111 and/or the second electrode 112 and the binding metal layer 21.

Figure 3:
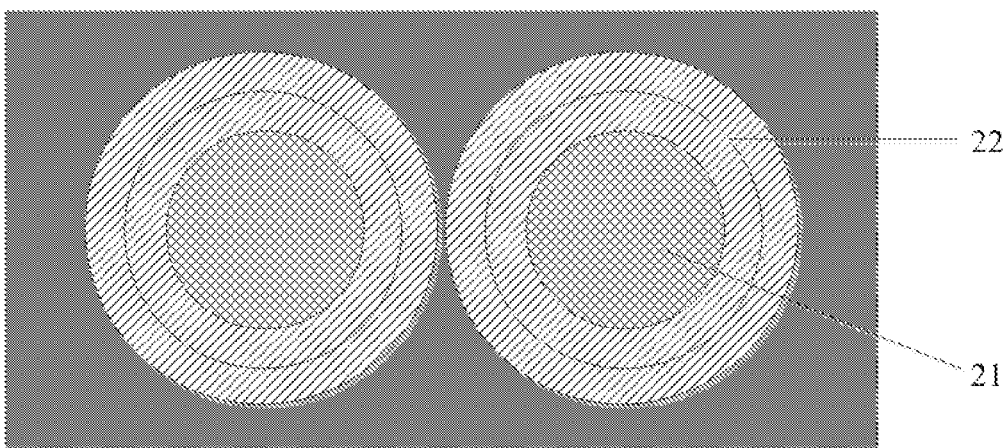
FIG. 3 is a top structural schematic view of the driving substrate according to an embodiment of the present disclosure.

In a first embodiment, the sidewall of the positioning layer 22 is connected with the binding metal layer 21. In the first embodiment, a positioning layer 22 is arranged around each binding metal layer 21. In some embodiments, as shown in FIG. 3, FIG. 3 is a top structural schematic view of the driving substrate according to an embodiment of the present disclosure. As shown in FIG. 3, the sidewall of the positioning layer 22 and the binding metal layer 21 form a funnel-shaped/bowl-shaped crater. The sidewall of the positioning layer 22 is disposed on a side of the positioning layer 22 close to the binding metal layer 21. The crater is formed with the binding metal layer 21 as a bottom surface and the sidewall of the positioning layer 22 as a wall surface. An opening defined on a side of the crater away from the driving substrate 2 is larger than an opening defined on a side of the crater close to the driving substrate 2, that is, a groove with a wide top and a narrow bottom is defined. The bottom of the groove is the binding metal layer 21, thereby improving the accuracy of the alignment of the first electrode 111 and the second electrode 112 and the binding metal layer 21.

In this embodiment, the binding metal layer 21 has a certain height on a surface of the driving substrate 2, and the side surface of the binding metal layer 21 is substantially perpendicular to the surface of the driving substrate 2. In other embodiments, an inclined plane is defined by the sidewall of the binding metal layer 21 and the surface of the driving substrate 2, which is not limited herein.

In this embodiment, the sidewall of the positioning layer 22 close to binding metal layer 21 is a slope, as shown in FIG. 2.

Figure 4:
FIG. 4 is a structural schematic view of the driving substrate according to a second embodiment of the present disclosure.

In a second embodiment, the bowl-shaped crater is defined by the sidewall of the positioning layer 22 and the binding metal layer 21. In this embodiment, the sidewall on the side of the positioning layer 22 close to the binding metal layer 21 is a recessed surface. In some embodiments, further as shown in FIG. 4, FIG. 4 is a structural schematic view of the driving substrate according to a second embodiment of the present disclosure. As shown in FIG. 4, the sidewall of the positioning layer 22 is a recessed surface facing the side of the binding metal layer 21. Similarly, the recessed surface is arranged around the binding metal layer 21. The sidewall of the positioning layer 22 is the recessed surface, such that when the first electrode 111 and the second electrode 112 slide close to the binding metal layer 21, there is a buffer zone, thereby preventing the first electrode 111 and the second electrode 112 from piercing the binding metal layer 21 due to an excessive pressure or speed.

In this embodiment, the binding metal layer 21 includes a material such as tin, indium, or the like, which is relatively soft in texture and easy to be pierced.

In other embodiments, the sidewall of the positioning layer 22 is not connected with the binding metal layer 21, which may refer to other embodiments for details, and is not limited herein.

In the above-mentioned embodiments, the first electrode 111 and the second electrode 112 are rectangular, or each of the first electrode 111 and the second electrode 112 has a diamond angle on a side close to the driving substrate 2.

Figure 5:
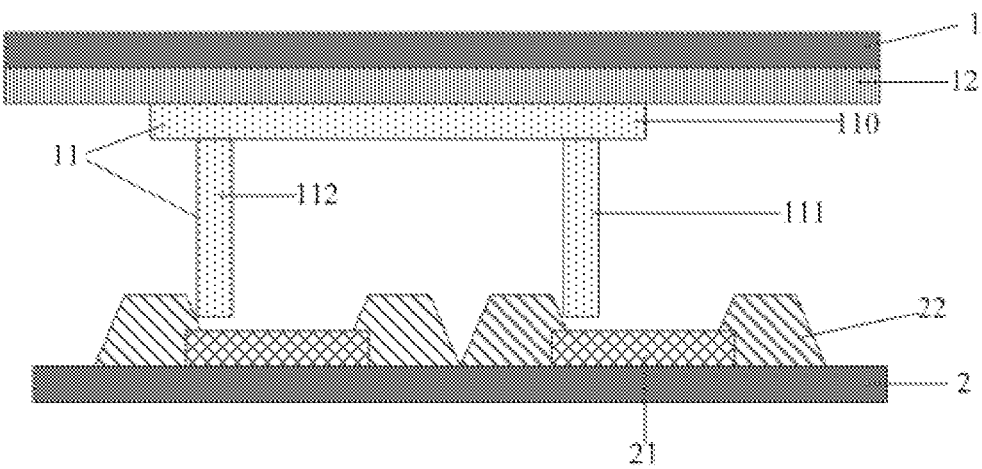
FIG. 5 is a structural schematic view of a micro LED transfer system according to an embodiment of the present disclosure.

A micro LED transfer system is provided by the present disclosure. As shown in FIG. 5, FIG. 5 is a structural schematic view of a micro LED transfer system according to an embodiment of the present disclosure. The micro LED transfer system includes a micro LED transfer device and the driving substrate 2 according to any one of above embodiments, and the micro LED transfer device is configured to transfer the micro LED to the driving substrate 2.

The micro LED transfer device includes a transfer substrate 1. A LED chip 11 is placed/arranged on a side surface of the transfer substrate 1, and includes the LED epitaxial layer 110 and the LED electrode. A part of the LED epitaxial layer 110 is composed of a crystal-lamination layer. The first electrode 111 and the second electrode 112 are arranged on a surface of each LED chip 11 away from the transfer substrate 1. The first electrode 111 and the second electrode 112 are collectively referred to as LED electrodes. In an embodiment, a plurality of LED chips 11 are arranged on the transfer substrate 1 to realize batch transfer of a plurality of micro LED/LED chips 11 at the same time. The plurality of LED chips 11 are arranged in an array on the transfer substrate 1 and arranges at intervals from each other, which is not limited herein.

An end of the LED electrode away from the transfer substrate is in a gradually tapered shape.

Figure 6:
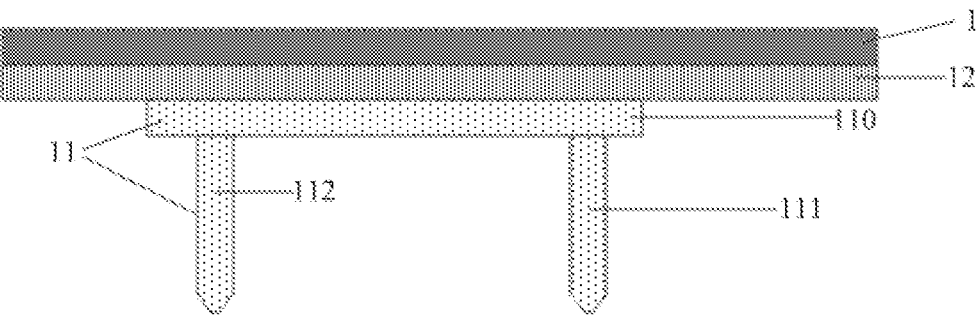
FIG. 6 is a structural schematic view of a micro LED transfer device according to a first embodiment of the present disclosure.

In the first embodiment, a slope is arranged on an end of each of the first electrode 111 and the second electrode 112 away from the transfer substrate 1. In some embodiments, as shown in FIG. 6. FIG. 6 is a structural schematic view of a micro LED transfer device according to a first embodiment of the present disclosure. A structure of the positioning layer 22 of the driving substrate 2 is shown in FIG. 2. The sidewall of the positioning layer 22 is a slope, and the slope of each of the first electrode 111 and the second electrode 112 match the slope of the sidewall of the positioning layer 22. In some embodiments, an inclined degree of the slope of each of the first electrode 111 and the second electrode 112 is the same as that of the slope of the sidewall of the positioning layer 22, such that the first electrode 111 and the second electrode 112 may slide along the sidewall of the positioning layer 22.

Figure 7:
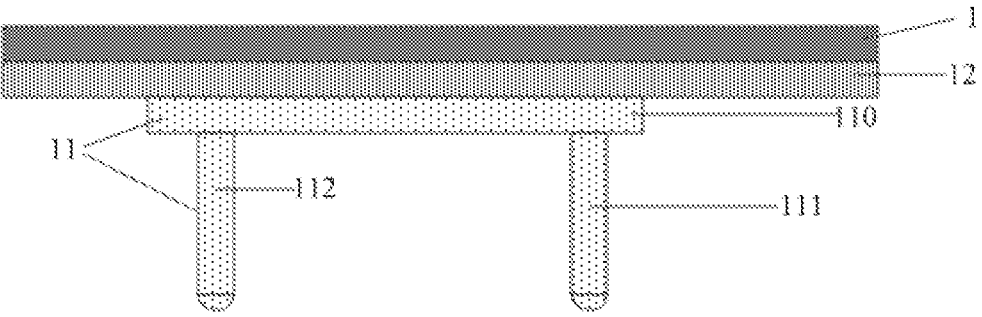
FIG. 7 is a structural schematic view of the micro LED transfer device according to a second embodiment of the present disclosure.

A second micro LED transfer device is provided by the present disclosure. As shown in FIG. 7, FIG. 7 is a structural schematic view of the micro LED transfer device according to a second embodiment of the present disclosure. A convex surface is arranged on an end of each of the first electrode 111 and the second electrode 112 away from the transfer substrate 1. The structure of the positioning layer 22 of the driving substrate 2 is shown in FIG. 4. The sidewall of the positioning layer 22 is a recessed surface, and the convex surfaces of the first electrode 111 and the second electrode 112 match the recessed surface of the sidewall of the positioning layer 22.

As described in the above-mentioned embodiments, the first electrode 111 and the second electrode 112 are made into slopes or convex surfaces matching the sidewall of the positioning layer 22, thereby improving the adaptability between the first electrode 111 and the second electrode 112 and the positioning layer 22, and further reducing a case of tilting or abnormal positioning during the transfer of the LED chip 11. In other embodiments, the LED electrode may not be formed as the gradually tapered shape.

Figure 8:
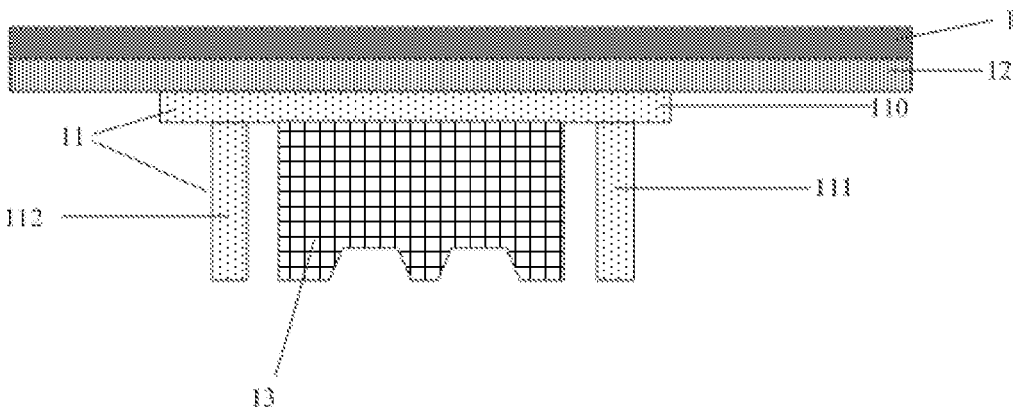
FIG. 8 is a structural schematic view of the micro LED transfer device according to a third embodiment of the present disclosure.

A third embodiment is further provided by the present disclosure. As shown in FIG. 8, FIG. 8 is a structural schematic view of the micro LED transfer device according to a third embodiment of the present disclosure. A supporting member 13 is arranged between the first electrode 111 and the second electrode 112. The supporting member 13 is matched with the structure of the positioning layer 22 between the adjacent two binding metal layers 21, such that the supporting member 13 is engaged with the positioning layer during the transfer process to fix the LED chip 11. In addition to the structure shown in FIG. 8, the supporting member 13 may also be a conical structure to be inserted between two positioning layers 22, thereby supporting the micro LED, which is not limited herein.

In this embodiment, the supporting member 13 includes organic materials, such as PI and PMMA, and so on, and is prone to deformation. The supporting member 13 is configured to deform during a process of the first electrode 111 and the second electrode 112 approaching the binding metal layer 21, such that the supporting member 13 is engaged with the positioning layer 22, thereby fixing the LED chip 11 and preventing the LED chip 11 from tilting. In this embodiment, a height of the supporting member 13 is the same as that of the first electrode 111 and the second electrode 112. The supporting member 13 is an organic material including acidic groups, such as PI, PMMA, etc., which is easy to remove in alkaline solution, such that the supporting member 13 may be removed through the alkaline solution after the first electrode 111 is aligned with the second electrode 112.

Figure 9:
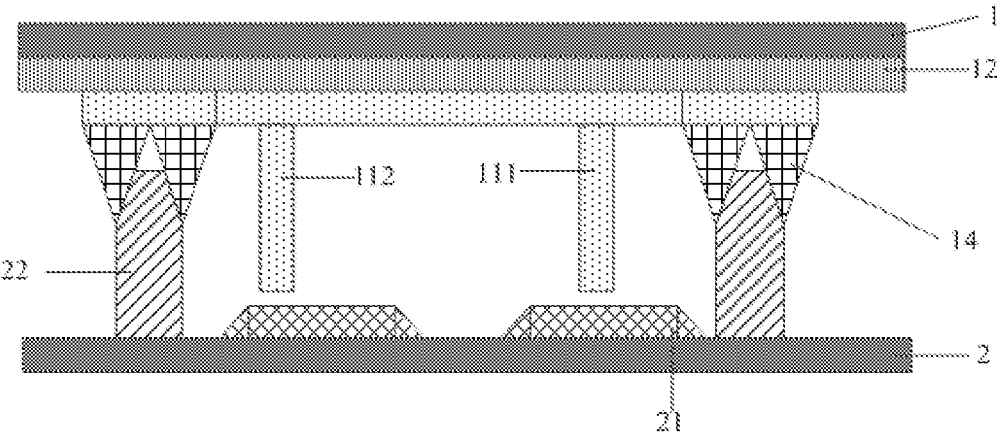
FIG. 9 is a structural schematic view of the micro LED transfer device according to a fourth embodiment of the present disclosure.

A fourth embodiment is further provided by the present disclosure. As shown in FIG. 9, FIG. 9 is a structural schematic view of the micro LED transfer device according to a fourth embodiment of the present disclosure. Each of the two sides of the transfer substrate 1 corresponding to the LED chip 11 is further arranged with a positioning member 14, and the positioning member 14 may be a double-funnel shaped or double-bowl shaped structure, or other structures. A groove is defined in the middle of the positioning member 14, and a shape of the groove is preferred to match the structure of the positioning layer 22.

In an embodiment, the positioning member 14 is the double-funnel shaped structure, that is, the groove is formed in the middle of the positioning member 14, and the groove may be the funnel-shaped/bowl-shaped crater shown in FIG. 1, which is not limited herein. In this embodiment, the positioning layer 22 of the driving substrate 2 is a cone with a narrow upper top and a narrow bottom or other shapes. The positioning layer 22 matches the shape of the groove defined in the middle of the positioning member 14, thereby realizing the alignment of the LED chip 11 and the binding metal layer 21 through the positioning layer 22 and the positioning member 14.

Compared to the structure in the previous embodiments, the positioning layer 22 in this embodiment is defined around every two binding metal layers 21 and is spaced with the binding metal layers, such that the positioning layers 22 may be aligned with the positioning members 14 disposed on both sides of the LED chip 11.

Figure 10:
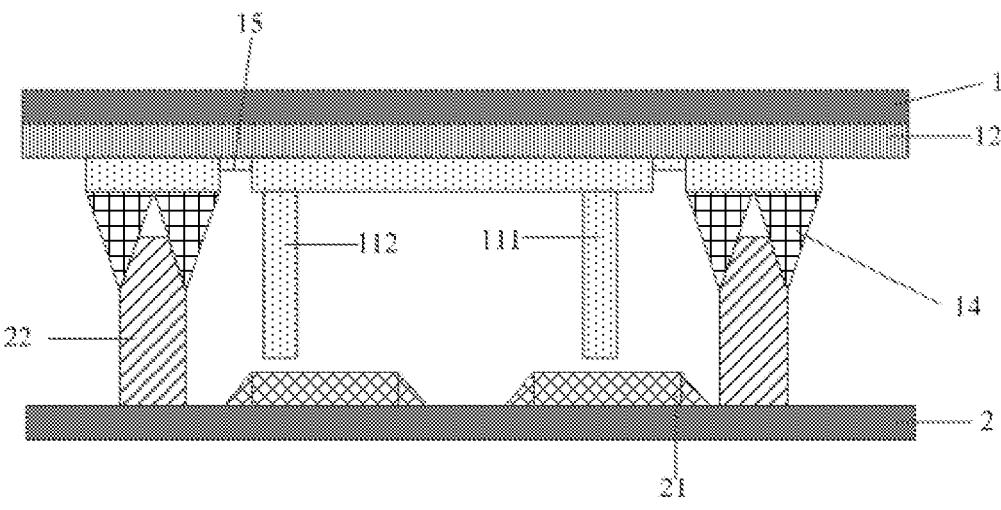
FIG. 10 is a structural schematic view of the micro LED transfer device according to a fifth embodiment of the present disclosure.

A fifth embodiment is further provided by the present disclosure. As shown in FIG. 10, FIG. 10 is a structural schematic view of the micro LED transfer device according to a fifth embodiment of the present disclosure. FIG. 10 is a further embodiment shown in FIG. 9. The positioning member 14 is connected to the LED chip 11 through the fracturing member 15. Compared with the LED chip, the fracturing member 15 is easy to fracture under external force, thus facilitating to remove the positioning member 14 after finishing alignment.

In some embodiments, the fracturing member 15 is connected with the positioning member 14 and the LED chip, and is easy to fracture under the external force, thus facilitating to remove the positioning member 14. In other embodiments, the fracturing member 15 may also be other fixing members and may be easily removed after finishing alignment, which is not limited herein. In this embodiment, the fracturing member 15 may be removed by an weakly adhesive substrate, and an adhesive force of the weakly adhesive substrate is greater than a breaking force required for fracturing the positioning member 14 and the LED chip 11, and is less than a fixing force, namely, a welding force, between the binding metal layer 21 and the first electrode 111 and/or the second electrode 112.

In the above-mentioned embodiments, a height/thickness of the positioning layer 22 disposed on the driving substrate 2 is less than a height/thickness of the first electrode 111 and/or the second electrode 112 disposed on the transfer substrate 1. The height of the first electrode 111 is the same as that of the second electrode 112.

In the present disclosure, in order to achieve an accurate alignment between the binding metal layer 21 and the LED electrode, the positioning layer with a slope is arranged around the binding metal layer 21 to assistant the LED electrode and the binding metal layer 21 to achieve accurate positioning.

Figure 11:
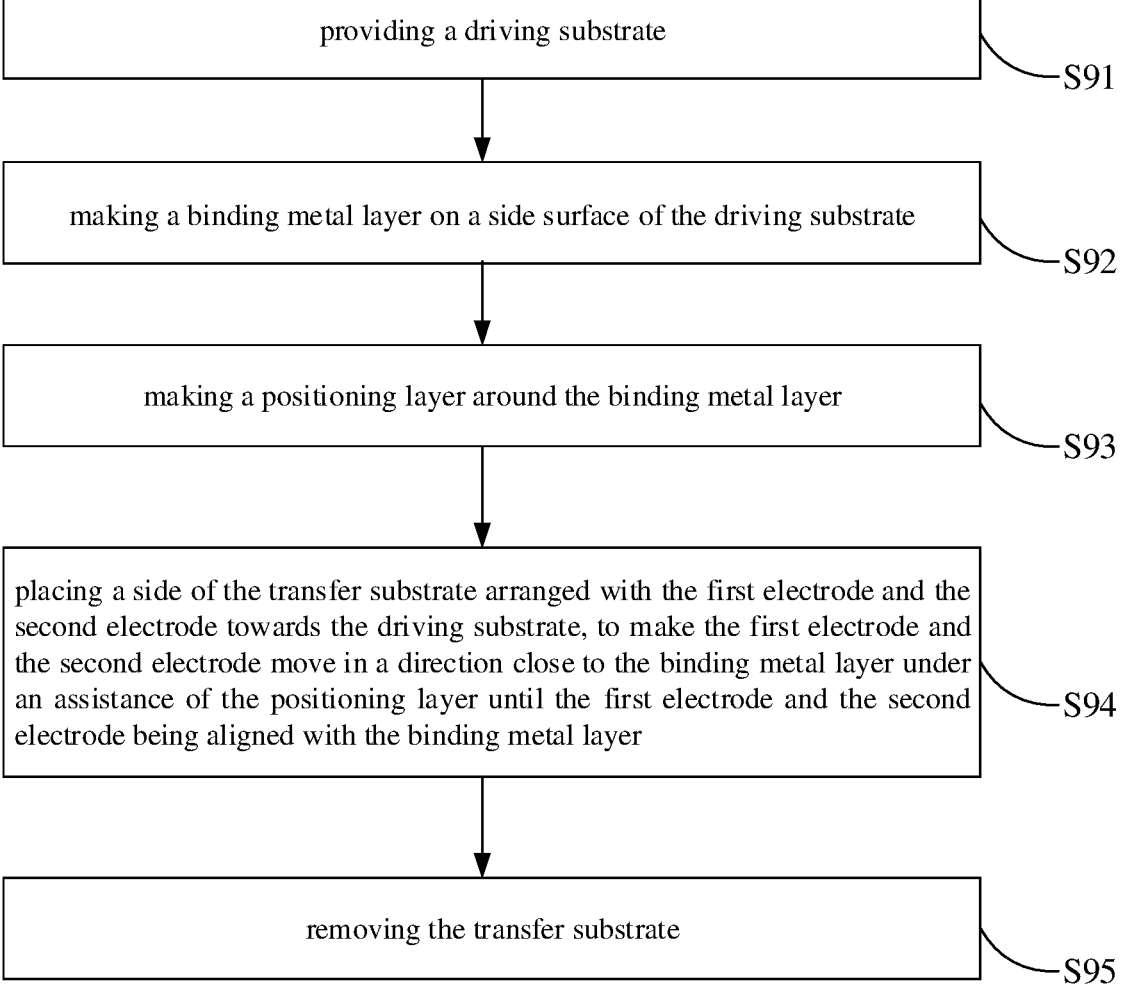
FIG. 11 is a flow diagram of a micro LED transfer method according to some embodiments of the present disclosure.

A micro LED transfer method is further provided by the present disclosure. In some embodiments, as shown in FIG. 11, FIG. 11 is a flow diagram of a micro LED transfer method according to some embodiments of the present disclosure. The micro LED includes the LED chip placed on an array substrate, and the first electrode and the second electrode arranged on the surface of the LED chip. The micro LED transfer method include operations executed by the following blocks.

At block S91, a driving substrate is provided.

In some embodiments, the driving substrate is a driving backplane, such as a Low Temperature Poly-silicon Thin Film Transistor (LTPS-TFT), an amorphous silicon TFT, an Indium Gallium Zinc Oxide (IGZO)-TFT, a monocrystalline silicon Metal-Oxide-Semiconductor Field-Effect Transistor (MOS), or the like, which are not limited herein.

At block S92, a binding metal layer is made on a side surface of the driving substrate.

In an embodiment, the binding metal layer is formed on the surface of the driving substrate by means of an evaporation process. The binding metal layer is disposed correspondingly to the first electrode and second electrode. In this embodiment, the binding metal layer is formed by a soft metal, such as indium (In), or tin (Sn).

At block S93, a positioning layer is made around the binding metal layer.

In some embodiments, the positioning layer is made around the binding metal layer by means of a film-forming technology or a photolithography technology, such that the positioning layer is disposed around the binding metal layer to assist the alignment of the LED electrode and the binding metal layer.

The positioning layer may be an organic compound such as PI, PMMA, etc., or an inorganic compound such as SiNx, SiOx, etc., which is not limited herein.

In this embodiment, a width of the formed positioning layer at a position away from the driving substrate is less than a width at a position close to the driving substrate, that is, the positioning layer is a structure with a wide top and a narrow bottom. A sidewall of the positioning layer forms a certain slope, such that the first electrode and the second electrode may slide to a corresponding position of the binding metal layer by gravity, thereby assisting the LED electrode to align.

At block S94, a side of the transfer substrate arranged with the first electrode and the second electrode is placed towards the driving substrate, so as to make the first electrode and the second electrode move in a direction close to the binding metal layer under an assistance of the positioning layer until the first electrode and the second electrode being aligned with the binding metal layer.

An alignment connection includes an alignment and a connection. In some embodiments, the binding metal layer is welded with the first electrode and the second electrode under a preset temperature condition, so as to fix the LED chip through the binding metal layer. In some embodiments, under a high temperature condition, the binding metal layer is melted, such that the first electrode and second electrode are trapped in the binding metal layer and welded with the binding metal layer.

In this embodiment, the binding metal layer includes the In or the Sn. A melting temperature of the In is above 160° C., and a melting temperature of the Sn is above 240° C. The preset temperature condition refers to a high temperature condition greater than 240° C.

In an embodiment, the positioning layer is arranged along an edge of the binding metal layer and connected to the edge of the binding metal layer. The sidewall of the positioning layer and the binding metal layer form a funnel-shaped crater as shown in FIG. 1. In the first embodiment, the operation executed by the block S94 further includes: the first electrode and/or the second electrode moving along the sidewall of the positioning layer towards the binding metal layer by gravity until the first electrode and the second electrode being aligned with the binding metal layer. In the second embodiment, the operation executed by the block S94 further includes: magnetizing the first electrode and/or the second electrode to make the first electrode and/or the second electrode move along the sidewall of the positioning layer towards the binding metal layer under the action of magnetic force, so as to achieve the alignment. In the third embodiment, the operation executed by the block S94 further includes: pressing the surface of the LED chip away from the first electrode and/or the second electrode by means of a non-adhesive substrate until the first electrode and the second electrode being aligned with the binding metal layer. The electrode may be aligned and connected with the binding metal layer through any of the above-mentioned methods.

The sidewall of the positioning layer may be a slope, and the funnel-shaped crater is formed by the sidewall of the positioning layer together with the binding metal layer. The sidewall of the positioning layer may be a recessed surface, a bowl-shaped crater and the funnel-shaped crater is formed by the sidewall of the positioning layer together with the binding metal layer.

In another embodiment, a flexible support structure is further arranged between the first electrode and the second electrode. The operation executed by the block S94 further includes: utilizing external force to make the flexible support structure to deform under pressure, to be engaged with the positioning layer to fix the LED chip, thereby fixing the LED chip to reduce tilting during an aligning process. The flexible support structure includes an organic material composed of an acidic group, such as PI, PMMA, etc. After the operation executed by the block S94, the micro LED transfer method further includes: dissolving the support structure with an alkaline solution to remove the support structure. The flexible support structure may also be the supporting member according to any one of the above-mentioned embodiments, which is not limited herein.

In another embodiment, two sides of the LED chip are further arranged with a positioning member, and the positioning member is connected to the micro LED through a fracturing member. The operation executed by the block S94 further includes: removing the positioning member by means of an adhesive substrate with an adhesion force greater than a breaking force between the fracturing member and the LED chip. In some embodiments, the fracturing member and the LED chip break under the action of the adhesive force, so as to remove the fracturing member and the positioning member after finishing alignment. The adhesive force is further less than a fixing force/a welding force between the binding metal layer and the first electrode and the second electrode. In other embodiments, the fracturing member may be a fracturing groove formed by means of a LED epitaxial layer being partially etched. Compared with the LED epitaxial layer, a forming layer of the fracturing member is very thin and easy to fracture, and a material of the fracturing member is not limited herein.

At block S95, the transfer substrate is removed.

In an embodiment, an adhesive layer is further arranged between the transfer substrate and the LED chip. The adhesive layer has a laser or pyrolysis property. After the operation executed by the block S94, the operation of removing the transfer substrate includes: using a laser or pyrolysis process to lose an adhesion of the adhesive layer, so as to remove the transfer substrate, thereby releasing the LED chip from the transfer substrate and transferring the LED chip to the driving substrate.

The beneficial effect of this embodiment is that: by making the positioning layer at least at a binding position of the driving substrate, the positioning layer and the binding metal layer form the funnel-shaped groove with an upper opening larger than a lower opening, so as to increase an alignment area between the LED electrode and the binding metal layer and improve an alignment probability, and further make the LED electrode and the binding metal layer form accurate alignment on the slope of the positioning layer. In addition, the supporting member or the positioning member is arranged on the transfer substrate, and the electrode is sharpened, thereby further improving the accuracy of the LED electrode being aligned with the binding metal layer.

According to a first aspect of the present disclosure, a driving substrate is provided. A side surface of the driving substrate is arranged with a binding metal layer, a positioning layer is arranged around the binding metal layer, and a width of the positioning layer at a position away from the driving substrate is less than a width of the positioning layer at a position close to the driving substrate.

In some embodiments, a sidewall of the positioning layer is connected with the binding metal layer, and a funnel-shaped crater or a bowl-shaped crater is defined by the sidewall of the positioning layer and the binding metal layer; and an opening defined on a side of the crater away from the driving substrate is larger than an opening defined on a side of the crater close to the driving substrate.

According to a second aspect of the present disclosure, a micro LED transfer device is provided. The micro LED transfer device includes: a transfer substrate; and a micro LED, arranged on the transfer substrate and configured for transferring the micro LED to the above-mentioned driving substrate. Each micro LED includes two electrodes, and the two electrodes extend to the side away from the transfer substrate; and wherein an end of each of the two electrodes away from the transfer substrate is in a gradually tapered shape.

In some embodiments, the binding metal layer comprises indium or tin mental.

In some embodiments, a sidewall of the positioning layer forms a slope.

In some embodiments, a sidewall of the positioning layer is a recessed surface facing the side of the binding metal layer.

In some embodiments, a slope or a convex surface is arranged on a side surface of each of the two electrodes away from the transfer substrate.

In some embodiments, the surface of a side of the transfer substrate arranged with a LED is further arranged with a positioning member adjacent to the LED, the positioning member is composed of two funnel-shaped fixing members, and the two funnel-shaped fixing members are adjacent to each other to form a groove to align with the positioning layer.

In some embodiments, a fracturing member is arranged between the positioning member and the micro LED, and the fracturing member is connected with the positioning member and the micro LED and is easy to fracture under an action of external force.

In some embodiments, a supporting member is arranged between the two electrodes of the same micro LED to be engaged with the positioning layer arranged between two adjacent binding metal layers.

In some embodiments, an adhesive layer is arranged between the transfer substrate and the micro LED, and the micro LED is adhered to a side of the transfer substrate through the adhesive layer.

According to a third aspect of the present disclosure, a micro LED transfer method is provided. The micro LED includes an LED chip, and a first electrode and a second electrode arranged on a surface of the LED chip, the micro LED is disposed on a transfer substrate, and the micro LED transfer method includes: providing a driving substrate; making a binding metal layer on a side surface of the driving substrate; making a positioning layer around the binding metal layer; wherein a width of the positioning layer at a position away from the driving substrate is less than a width of the positioning layer at a position close to the driving substrate; placing a side of the transfer substrate arranged with the first electrode and the second electrode towards the driving substrate, to make the first electrode and the second electrode move in a direction close to the binding metal layer under an assistance of the positioning layer until the first electrode and the second electrode being aligned with the binding metal layer; and removing the transfer substrate to transfer the micro LED from the transfer substrate to the driving substrate.

In some embodiments, after placing a side of the transfer substrate arranged with the first electrode and the second electrode towards the driving substrate, to make the first electrode and the second electrode move in a direction close to the binding metal layer under an assistance of the positioning layer until the first electrode and the second electrode being aligned with the binding metal layer, the micro LED transfer method further include: welding the binding metal layer with the first electrode and/or the second electrode at a preset temperature.

In some embodiments, an adhesive layer is arranged between the transfer substrate and the LED chip; the removing the transfer substrate includes: using a laser or pyrolysis process to lose an adhesion of the adhesive layer, so as to remove the transfer substrate.

In some embodiments, a funnel-shaped crater is defined by a sidewall of the positioning layer and the binding metal layer; and the placing a side of the transfer substrate arranged with the first electrode and the second electrode towards the driving substrate, to make the first electrode and the second electrode move in a direction close to the binding metal layer under an assistance of the positioning layer until the first electrode and the second electrode being aligned with the binding metal layer, includes: the first electrode and/or the second electrode moving along a sidewall of the positioning layer towards the binding metal layer by gravity; or magnetizing the first electrode and/or the second electrode to make the first electrode and/or the second electrode move along the sidewall of the positioning layer towards the binding metal layer under the action of magnetic force; or pressing a surface of the LED chip away from the first electrode and/or the second electrode by means of a non-adhesive substrate, such that the first electrode and/or the second electrode move along the sidewall of the positioning layer towards the binding metal layer.

In some embodiments, a flexible support structure is further arranged between the first electrode and the second electrode; the pressing a surface of the LED chip away from the first electrode and/or the second electrode by means of using a non-adhesive substrate, such that the first electrode and/or the second electrode move along the sidewall of the positioning layer along the direction close to the binding metal layer, further includes: utilizing external force to make the flexible support structure to deform under pressure, to be engaged with the positioning layer to fix the LED chip.

In some embodiments, the flexible support structure is an organic material including an acid group.

In some embodiments, each of two sides of the LED chip is further arranged with a positioning member composed of two funnel-shaped fixing members, and the positioning member is connected with the micro LED through a fracturing member; after placing a side of the transfer substrate arranged with the first electrode and the second electrode towards the driving substrate, to make the first electrode and the second electrode move in a direction close to the binding metal layer under an assistance of the positioning layer until the first electrode and the second electrode being aligned with the binding metal layer, the micro LED transfer method further includes: removing the positioning member by means of an adhesive substrate with an adhesion force greater than a breaking force between the fracturing member and the LED chip; wherein the adhesive force of the adhesive substrate is further less than a fixing force between the binding metal layer and the first electrode and/or the second electrode.

In some embodiments, the making a binding metal layer on a side surface of the driving substrate includes: forming the binding metal layer on the side surface of the driving substrate by means of an evaporation process.

In some embodiments, the making a positioning layer around the binding metal layer includes making the positioning layer around the binding metal layer by means of a film-forming technology or a photolithography technology.

The above shows only embodiments of the present disclosure and does not limit the scope of the present disclosure. Any equivalent structure or equivalent process transformation performed based on the specification and accompanying drawings of the present disclosure, directly or indirectly applied in other related fields, shall be equivalently covered by the present disclosure.

What is claimed is:

1. A micro light-emitting diode (LED) transfer device, comprising:
   a transfer substrate; and
   a micro LED, arranged on the transfer substrate and configured for transferring the micro LED to a driving substrate,
   wherein each micro LED comprises two electrodes, and the two electrodes extend to the side away from the transfer substrate; and
   wherein an end of each of the two electrodes away from the transfer substrate is in a gradually tapered shape; and
   wherein a side surface of the driving substrate is arranged with a binding metal layer, a positioning layer is arranged around the binding metal layer, and a width of the positioning layer at a position away from the driving substrate is less than a width of the positioning layer at a position close to the driving substrate;
   wherein the surface of a side of the transfer substrate arranged with a LED is further arranged with a positioning member adjacent to the LED, the positioning member is composed of two funnel-shaped fixing members, and the two funnel-shaped fixing members are adjacent to each other to form a groove to align with the positioning layer.

2. The micro LED transfer device as claimed in claim 1, wherein a sidewall of the positioning layer is connected with the binding metal layer, and a funnel-shaped crater or a bowl-shaped crater is defined by the sidewall of the positioning layer and the binding metal layer; and an opening defined on a side of the crater away from the driving substrate is larger than an opening defined on a side of the crater close to the driving substrate.

3. The micro LED transfer device as claimed in claim 1, wherein the binding metal layer comprises indium or tin mental.

4. The micro LED transfer device as claimed in claim 1, wherein a sidewall of the positioning layer forms a slope.

5. The micro LED transfer device as claimed in claim 1, wherein a sidewall of the positioning layer is a recessed surface facing the side of the binding metal layer.

6. The micro LED transfer device as claimed in claim 1, wherein a slope or a convex surface is arranged on a side surface of each of the two electrodes away from the transfer substrate.

7. The micro LED transfer device as claimed in claim 1, wherein a fracturing member is arranged between the positioning member and the micro LED, and the fracturing member is connected with the positioning member and the micro LED and is easy to fracture under an action of external force.

8. The micro LED transfer device as claimed in claim 1, wherein a supporting member is arranged between the two electrodes of the same micro LED to be engaged with the positioning layer arranged between two adjacent binding metal layers.

9. The micro LED transfer device as claimed in claim 1, wherein an adhesive layer is arranged between the transfer substrate and the micro LED, and the micro LED is adhered to a side of the transfer substrate through the adhesive layer.

10. A micro LED transfer method, wherein the micro LED comprises an LED chip, and a first electrode and a second electrode arranged on a surface of the LED chip, the micro LED is disposed on a transfer substrate, and the micro LED transfer method comprises:

providing a driving substrate;

making a binding metal layer on a side surface of the driving substrate;

making a positioning layer around the binding metal layer; wherein a width of the positioning layer at a position away from the driving substrate is less than a width of the positioning layer at a position close to the driving substrate;

placing a side of the transfer substrate arranged with the first electrode and the second electrode towards the driving substrate, to make the first electrode and the second electrode move in a direction close to the binding metal layer under an assistance of the positioning layer until the first electrode and the second electrode being aligned with the binding metal layer; and removing the transfer substrate to transfer the micro LED from the transfer substrate to the driving substrate;

wherein each of two sides of the LED chip is further arranged with a positioning member composed of two funnel-shaped fixing members, and the positioning member is connected with the micro LED through a fracturing member;

after placing a side of the transfer substrate arranged with the first electrode and the second electrode towards the driving substrate, to make the first electrode and the second electrode move in a direction close to the binding metal layer under an assistance of the positioning layer until the first electrode and the second electrode being aligned with the binding metal layer, the micro LED transfer method further comprises:

removing the positioning member by means of an adhesive substrate with an adhesion force greater than a breaking force between the fracturing member and the LED chip; wherein the adhesive force of the adhesive substrate is further less than a fixing force between the binding metal layer and the first electrode and/or the second electrode.

11. The micro LED transfer method as claimed in claim 10, wherein after placing a side of the transfer substrate arranged with the first electrode and the second electrode towards the driving substrate, to make the first electrode and the second electrode move in a direction close to the binding metal layer under an assistance of the positioning layer until the first electrode and the second electrode being aligned with the binding metal layer, the micro LED transfer method further comprise:

welding the binding metal layer with the first electrode and/or the second electrode at a preset temperature.

12. The micro LED transfer method as claimed in claim 10, wherein an adhesive layer is arranged between the transfer substrate and the LED chip;

the removing the transfer substrate comprises:

using a laser or pyrolysis process to lose an adhesion of the adhesive layer, so as to remove the transfer substrate.

13. The micro LED transfer method as claimed in claim 10, wherein a funnel-shaped crater is defined by a sidewall of the positioning layer and the binding metal layer; and the placing a side of the transfer substrate arranged with the first electrode and the second electrode towards the driving substrate, to make the first electrode and the second electrode move in a direction close to the binding metal layer under an assistance of the positioning layer until the first electrode and the second electrode being aligned with the binding metal layer, comprises:

the first electrode and/or the second electrode moving along a sidewall of the positioning layer towards the binding metal layer by gravity; or magnetizing the first electrode and/or the second electrode to make the first electrode and/or the second electrode move along the sidewall of the positioning layer towards the binding metal layer under the action of magnetic force; or pressing a surface of the LED chip away from the first electrode and/or the second electrode by means of a non-adhesive substrate, such that the first electrode and/or the second electrode move along the sidewall of the positioning layer towards the binding metal layer.

14. The micro LED transfer method as claimed in claim 13, wherein a flexible support structure is further arranged between the first electrode and the second electrode;

the pressing a surface of the LED chip away from the first electrode and/or the second electrode by means of using a non-adhesive substrate, such that the first electrode and/or the second electrode move along the sidewall of the positioning layer along the direction close to the binding metal layer, further comprises:

utilizing external force to make the flexible support structure to deform under pressure, to be engaged with the positioning layer to fix the LED chip.

15. The micro LED transfer method as claimed in claim 14, wherein the flexible support structure is an organic material comprising an acid group.

16. The micro LED transfer method as claimed in claim 10, wherein the making a binding metal layer on a side surface of the driving substrate comprises:

forming the binding metal layer on the side surface of the driving substrate by means of an evaporation process.

17. The micro LED transfer method as claimed in claim 10, wherein the making a positioning layer around the binding metal layer comprises:

making the positioning layer around the binding metal layer by means of a film-forming technology or a photolithography technology.

* * * * *